United States Patent [19]

Ghosh et al.

[11] 4,127,738

[45] Nov. 28, 1978

[54] PHOTOVOLTAIC DEVICE CONTAINING AN ORGANIC LAYER

[75] Inventors: Amal K. Ghosh, New Providence; Tom Feng, Morris Plains, both of N.J.

[73] Assignee: Exxon Research & Engineering Company, Florham Park, N.J.

[21] Appl. No.: 789,183

[22] Filed: Apr. 20, 1977

Related U.S. Application Data

[63] Continuation-in-part of Ser. No. 702,747, Jul. 6, 1976, abandoned, which is a continuation-in-part of Ser. No. 564,438, Apr. 2, 1975, abandoned.

[51] Int. Cl.$^2$ .................. H01L 31/04; H01L 31/06
[52] U.S. Cl. .................. 136/89 NB; 357/8; 357/15; 357/30; 250/211 J; 250/212
[58] Field of Search .................. 136/89 NB; 357/8, 15, 357/30; 250/211 J, 211 R, 212

[56] References Cited

U.S. PATENT DOCUMENTS

| | | | |
|---|---|---|---|
| 3,530,007 | 9/1970 | Golubovic | 136/89 |
| 3,597,196 | 8/1971 | Jones et al. | 96/16 |
| 3,789,216 | 1/1974 | Komp | 250/211 R |

OTHER PUBLICATIONS

"Solar Cells", National Academy of Sciences, Wash., D.C., 1972, pp. 16–17.
H. Meier et al., "P-N Junctions Between Organic & Inorganic Photoconductors", Ber. Bunsenges Physik. Chem., vol. 69, pp. 160–167 (1965).
C. W. Tang et al., "Photovoltaic Effects of Metal--Chlorophyll-A-Metal Sandwich Cells", J. Chem. Phys., vol. 62, pp. 2139–2149 (1975).
A. K. Ghosh et al., "Photovoltaic & Rectification Properties of Al/Mg Phthalocyanine/Ag Schottky Barrier Cells", J. Appl. Phys., vol. 45, pp. 230–236 (1974).
A. K. Ghosh et al., "Rectification, Space-Charge-Limited Current, Photovoltaic & Photoconductive Properties of Al/Tetracene/Au Sandwich Cell", J. Appl. Phys., vol. 44, pp. 2781–2788 (1973).
T. K. Mukherjee, "Photocurrents & Photopotentials In Organic Solids", Conf. Record, IEEE Photovoltaic Specialists Conf., Mar. 1967, pp. 7–23.
R.L. Gablin et a., "Solar Cell Utilizing Organic Photoconductor", IBM Tech. Disc. Bull., vol. 18, p. 2442 (1976).
V. Y. Merritt et al., "Organic Solar Cells of Hydroxy Squarylium", Appl. Phys. Lett., vol. 29, pp. 414–415 (1976).

Primary Examiner—John H. Mack
Assistant Examiner—Aaron Weisstuch
Attorney, Agent, or Firm—Joseph J. Dvorak

[57] ABSTRACT

A photovoltaic device for the conversion of light (preferably in the visible spectrum) to electrical current consists of at least two electrodes (one of which must be substantially transparent to the light), each electrode being made of different materials and in which one electrode comprises an element that has a work function (generally expressed in electron volts) greater than that of aluminum (e.g. gold or silver) and the other electrode comprises an element that has a work function equal to or less than that of aluminum (e.g., aluminum or magnesium). Sandwiched between and in contact with the electrodes is a photoresponsive organic layer comprising at least one organic compound which, in general, has the capacity to sensitize or de-sensitize silver halides, titanium dioxide, zinc oxide, cadmium sulfide, selenium and polyvinyl carbazole (examples of the organic compounds are the cyanine dyes, especially the merocyanine dyes). The electrode comprising an element having a work function equal to or less than aluminum forms a Schottky barrier with the organic layer. Optionally, an insulating film is interposed between the Schottky barrier elctrode and the organic layer.

19 Claims, 4 Drawing Figures

PHOTOVOLTAIC DEVICE CONTAINING AN ORGANIC LAYER

REFERENCE TO RELATED APPLICATIONS

This application is a continuation-in-part of our earlier application Ser. No. 702,747, filed July 6, 1976, and now abandoned which in turn is a continuation-in-part of Ser. No. 564,438, filed Apr. 2, 1975 and now abandoned.

BACKGROUND OF THE INVENTION

Organic dyestuffs are well known in the prior art as having the capacity to sensitize materials such as silver halides, zinc oxide, etc. and are therefore useful for photographic purposes; typically such dyestuffs are cyanine dyes, merocyanine dyes, azacyanine dyes, methine dyes, etc., see e.g. French Pat. No. 2,137,985, Canadian Pat. No. 849,450, U.S. Pat. No. 3,597,196, U.S. Pat. No. 3,110,591, etc. However, such dyestuffs, although they are good photoconductors, are very poor electrical conductors and therefore are reported to make relatively poor photovoltaic devices, i.e. a device which results in the direct conversion of light to electrical current (see "Solar Cells", National Academy of Sciences, 1972, p. 17).

Thus far in the prior art, when using such dyestuffs in photovoltaic devices, it has been found necessary to use them in combination with materials which form heterojunctions. That is, such materials are known to have the capacity to become sensitized or de-sensitized when placed in contact with these dyestuffs and exposed to light; typical examples of such materials are silver halides, titanium dioxide, zinc oxide, cadmium sulfide, selenium and polyvinylcarbazole.

In contrast to the prior art photovoltaic devices relying on the formation of heterojunctions, the present invention relies on the use of the same dyestuffs to form a Schottky barrier at the interface between the dyestuff and the electrode comprised of the element having a work function equal to or less than that of aluminum. That is, the materials such as silver halides, titanium dioxide, etc. described above are not used in contrast with these dyestuffs. Rather, certain elements, more particularly described below, are utilized as electrode materials in contrast with these dyestuffs and the resultant photovoltaic devices convert light (in the visible spectrum) into levels of electrical current which are orders of magnitude greater (e.g. hundreds of times greater) than that generated by photovoltaic devices relying on the formation of heterojunctions (e.g. see "p-n Junctions Between Organic and Inorganic Photoconductors" by H. Meier et al, *Ber. Bunsenges Physik. Chem.*, Volume 69, #2, pp. 160–167 (1965)).

In U.S. Pat. No. 3,530,007, Golubovic describes a solar cell in which the organic compound (e.g. a dyestuff) is in ohmic contact with both electrodes. In the instant invention, a non-ohmic contact is formed between the dyestuff and the electrode comprised of the element having a work function equal to or less than that of aluminum (thus giving rise to a Schottky barrier) and an ohmic contact is formed between the opposite surface of the dyestuff and the electrode comprised of the element having a work function greater than that of aluminum. It has been unexpectedly found that the particular organic compounds utilized in this invention (which differ from those utilized by Golubovic) result in high efficiencies (the Golubovic-type devices give low efficiencies), notwithstanding that such high efficiencies result from Schottky barrier formation (it generally being thought necessary to generate heterojunctions to obtain high efficiencies).

SUMMARY OF THE INVENTION

The present photovoltaic devices for the conversion of light (preferably in the visible spectrum) to electrical current comprise two electrodes (one of which must be substantially transparent to the light) in contact with a layer of an organic compound. Each electrode is made of a different material. One electrode, hereinafter referred to as a first electrode, comprises an element that has a work function (generally expressed in electron volts) greater than that of aluminum while the other electrode, hereinafter referred to as a second electrode, comprises an element that has a work function equal to or less than that of aluminum. In general, the photoresponsive layer which is sandwiched between the first and second electrodes comprises at least one organic compound which has the capacity to sensitize or de-sensitize a material selected from the group consisting of silver halides (especially silver bromide or silver iodide), titanium dioxide, zinc oxide, cadmium sulfide, selenium and polyvinyl carbazole. The organic layer forms a Schottky barrier with the second electrode. The organic layer is in ohmic contact with the first electrode.

In one embodiment of the present invention, a thin insulating layer is interposed between the second electrode and the organic layer.

DETAILED DESCRIPTION OF THE INVENTION

Figure 1:
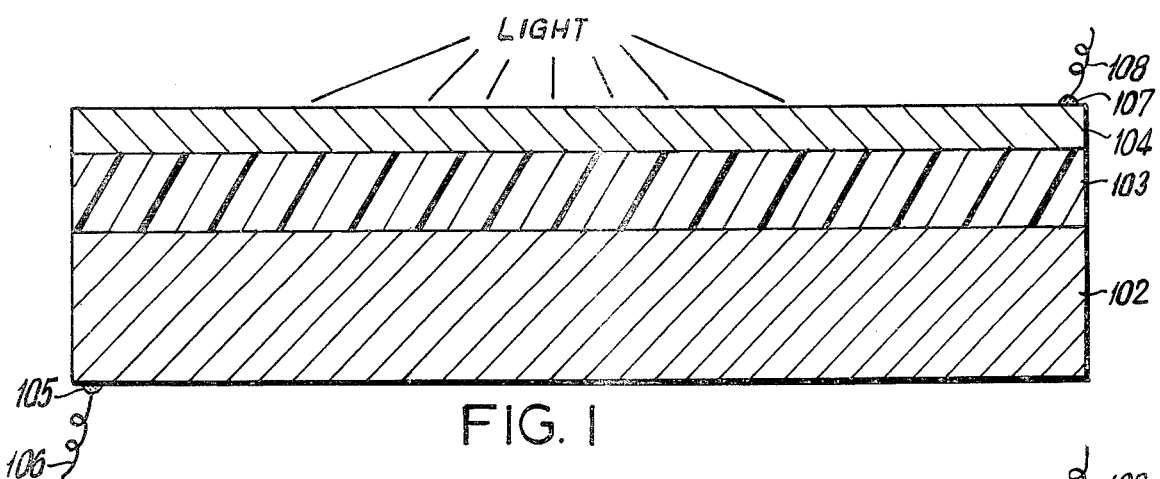
FIG. 1 represents a cross-sectional view of the photovoltaic device in which the first electrode, comprised of the element having a work function greater than that of aluminum, is exposed to a source of light (preferably in the visible spectrum).

Referring to the drawings, like numbers in each figure are intended to represent the same feature. In FIG. 1, 104 is a substantially transparent electrode comprised of the element having a work function greater than that of aluminum and is exposed to the light source. Feature 103 represents a layer of the organic compound in ohmic contact with electrode 104 and in non-ohmic contact with electrode 102, the latter electrode comprised of an element having a work function equal to or less than that of aluminum. Features 107 and 105 are contacts (formed out of electrically conducting materials such as silver paste, indium solder, conductive epoxy, etc.) for adhering leads 108 and 106 to electrodes 104 and 102. As the photovoltaic device is exposed to a light source, the electrical current generated thereby may be drawn off through leads 108 and 106.

Figure 2:
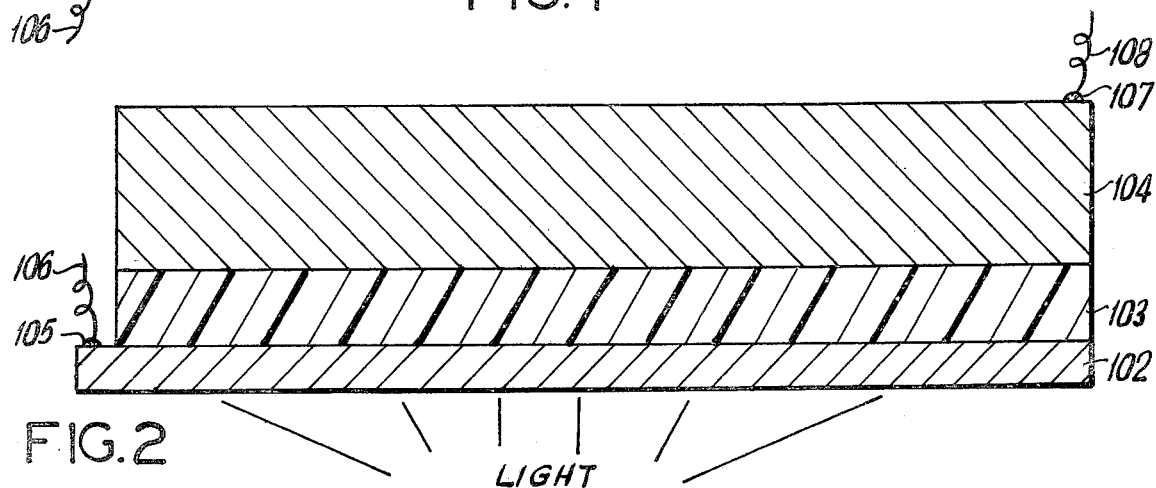
FIG. 2 represents a cross-sectional view of the photovoltaic device in which the second electrode, comprised of the element having a work function equal to or less than that of aluminum, is exposed to a source of light (preferably in the visible spectrum).

FIG. 2 is to the same effect, except that the substantially transparent electrode 102 is exposed to the light source.

Figure 3:
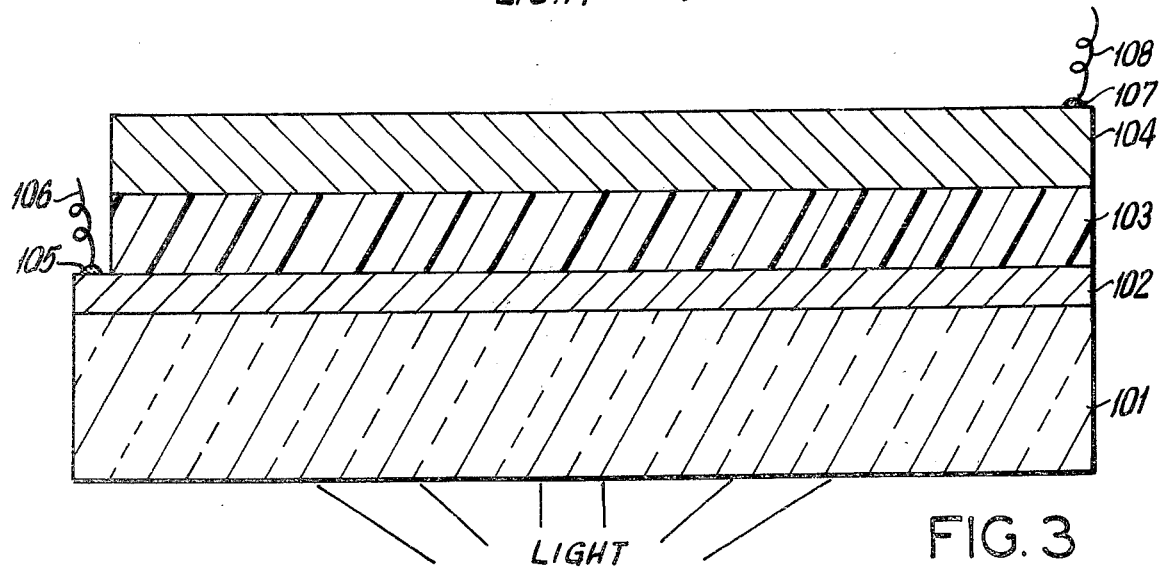
FIG. 3, also a cross-sectional view of the photovoltaic device, is a variation of FIG. 2 in that the second electrode is deposited on one face of a transparent sheet and the other face of the sheet is exposed to the light source.

In FIG. 3, the element comprising substantially transparent electrode 102 is deposited on one face of a transparent material such as polyethylene terephthalate ("Mylar"), glass, cellophane, clear plastics, quartz, etc. When such a transparent material is utilized, it is desirably thin to assure maximum transmission of light, e.g. such thickness may be 0.0005 to 1 inch. The other face of the transparent material is exposed to the light source. In view of the relatively thin layer of the substantially transparent electrode exposed to the light source (e.g., about 20 to 200 Angstroms, preferably 30 to 100 Angstroms thickness) and since it may be otherwise difficult to prepare an electrode of such thickness (as well as for the purpose of structural strength), it may be desirable to deposit the element comprising such electrode on such a transparent material. For thin films, a combination of thin films and grid structures may be desirable. Thus, although not shown in the drawings, it may also be desirable to have electrode 104 (which would then be substantially transparent) deposited on one face of such a transparent material, with the other face exposed to the light source. However, from a performance point of view, the use of the transparent material interposed between the light source and the electrode element is slightly disadvantageous since such material will not transmit 100% of the light hitting its surface to the underlying electrode (i.e. there may be some absorption and/or reflection of the light by the transparent material).

As mentioned previously, the electrode presented to the light source desirably has a thickness in the range of about 20 to about 200 Anstroms, preferably 30 to 100 Angstroms. This is to insure that such electrode is substantially transparent to the light source, thereby allowing the light to impinge upon the layer of the organic compound. However, that electrode which is not to be exposed to the light source may be of any thickness desired.

Figure 4:
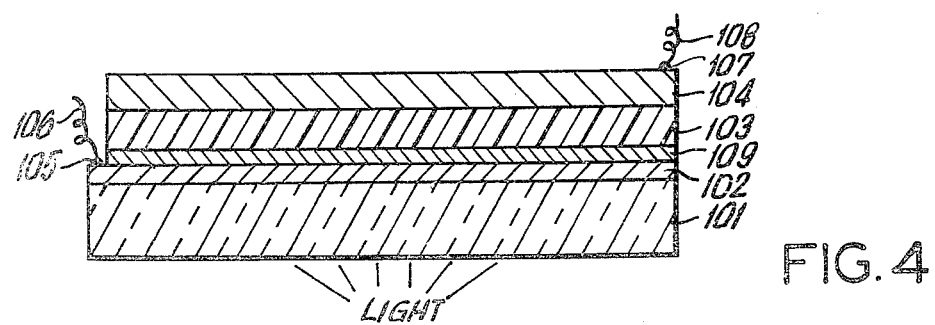
FIG. 4 represents a cross-sectional view of the photovoltaic device in which an insulating layer is interposed between the organic layer and the second electrode which in turn is deposited on the face of a transparent sheet.

FIG. 4 is to the same effect as FIG. 3, except that a thin insulating layer 109 is interposed between transparent electrode 102 and the organic layer 103. The insulating or oxide layer 109 desirably is less than about 30 Angstroms thick and preferably less than 25 Angstroms thick.

THE ELECTRODES

As mentioned above, each electrode is different. For the purposes of this invention, the elements making up each electrode should have the following properties:

(1) The elements should be non-gaseous at the temperatures expected to be present when the photovoltaic device is in use (e.g., about 20°–100° C. and atmospheric pressure); preferably, the element should be solid in nature throughout this temperature range although elements which are liquid in nature (e.g., mercury) and elements which have a relatively low melting point (e.g., gallium) may be used, especially if the electrode substrate is designed with a cavity or trough to accommodate the liquid.

(2) The elements should be non-radioactive in nature; thus, the actinides are not suitable elements.

(3) The elements should not be explosively reactive with water; thus, elements such as sodium, potassium, etc. are not suitable.

(4) The elements should be electrically conductive.

(5) The elements may be reactive in air (although in accordance with conventional hermetic-sealing techniques commonly employed with solar cells, the device of the present invention is preferably encapsulated or sealed with a suitable transparent material as mentioned above to minimize degradation of the electrode materials and the dyestuffs due to prolonged exposure to the environment). It has been found that elements which readily form oxide coatings on exposure to air do not preclude their use in this invention, provided that the oxide coating is not unusually thick, i.e. oxide coatings of about 30 Angstroms or less will not detract from the efficiency of the elements for the purposes of this invention. Indeed, it may be beneficial to allow the element to form the thin oxide coating between the electrode comprising an element having a work function equal to or lower than aluminum and the organic compound, and, in any event, it is not necessary to carry out a time-consuming, expensive cleaning of the surface of the element to remove any thin oxide coating which may be present thereon.

(6) The element chosen for the first electrode must have a work function greater than that of aluminum. Suitable elements meeting this work function requirement and the requirements of paragraphs (1)–(5) are: gold, silver, platinum, rhenium, iridium, mercury, bismuth, tungsten, osmium, tin, palladium, rhodium, ruthenium, molybdenum, copper, nickel, cobalt, iron, chromium and carbon. (See "Physics of Semiconductor Devices" by S. M. Sze, John Wiley & Sons, 1969 for the work function values, expressed in electron volts). The preferred elements are: gold, silver, platinum, rhenium, iridium, tungsten, tin, palladium, rhodium, molybdenum, copper, nickel, iron, chromium and carbon; particularly preferred elements are gold and silver.

(7) The elements chosen for the other electrode (which is the electrode preferentially exposed to the light source) must have a work function equal to or less than that of aluminum. Suitable elements meeting this work function requirement and the requirements of paragraphs (1)–(5) are: aluminum, magnesium, lithium, beryllium, calcium, scandium, titanium, vanadium, manganese, zinc, gallium, strontium, yttrium, zirconium, niobium, cadmium, indium, antimony, barium, lanthanum, cerium, praseodymium, neodymium, promethium, samarium, europium, gadolinium, terbium, disprosium, holmium, erbium, thulium, ytterbium, lutetium, hafnium, tantalum and lead. The preferred elements are: aluminum, magnesium, titanium, manganese, zinc, cadmium, indium, tantalum and lead; particularly preferred elements are aluminum and magnesium.

THE ORGANIC LAYER

As mentioned above, the organic layer comprises at least one organic compound which, in general, has the capacity to sensitize or desensitize a material selected from the group consisting of silver halides (e.g., AgBr, AgI, etc.), titanium dioxide, zinc oxide, cadmium sulfide, selenium and polyvinylcarbazole. The organic layer is preferentially present as a solid layer of about 50 to about 100,000 Angstroms in thickness, especially 50 to 10,000 Angstroms thickness. Preferably the organic layer is at least one organic dyestuff which absorbs light in the spectral range of about 0.3 to about 2 microns, especially 0.4 to 1.2 microns. Examples of dyestuffs which meet these criteria are set forth in Chapter II written by L. G. S. Brooker (pp. 198-232), in "The Theory of The Photographic Process" (edited by T. H. James), Third Edition, the MacMillan Company, New York, N.Y. (1966), which is incorporated herein by reference.

Suitable dyestuffs for the purposes of this invention may be classified as follows:

(a) cyanine dyes having an amidinium-ion chromophoric system (these include internally charge compensated cyanines);

(b) hemicyanine dyes having an amidinium-ion chromophoric system;

(c) phthalein dyes having a carboxyl-ion chromophoric system;

(d) oxonol dyes having a carboxyl-ion chromophoric system; and (e) merocyanine dyes having an amidic chromophoric system (this latter class of dyes is preferred for the purposes of this invention).

The merocyanine dyes most useful for the purposes of this invention are embraced by the general formula:

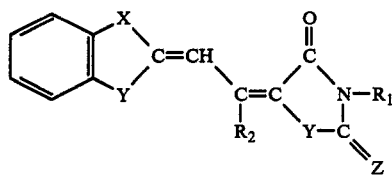

wherein X represents a member selected from the class consisting of sulfur, oxygen, $NR_3$ groups and $C(R_4)_2$ groups in which $R_3$ and $R_4$ are alkyl groups; Y represents a member selected from the class consisting of sulfur, oxygen and $NR_3$ groups; $R_1$ represents a member selected from the class consisting of carboxyalkyl groups, hydrogen, alkyl groups and carbalkoxyalkyl groups; $R_2$ represents a member selected from the class consisting of hydrogen and alkyl groups; and Z is a member selected from the class consisting of sulfur, oxygen and

groups in which J represents a member selected from the class consisting of a cyano group and the atoms with Q necessary to complete a heterocyclic ring selected from the class consisting of those of the oxindole series, those of the rhodanine series, those of the 2-thio-2,4-oxazolidinedione series, those of the 2-thio-2,5-thiazolidinedione series, those of the 2,4-thiazalidinedione series, those of the thiazolidinone series, those of the 4-thiazolinone series, those of the 2,4-imidazolinedione series, those of the 2-thio-2,4-imidazolinedione series, and those of the 5-imidazolinone series; Q, when J represents a cyano group, represents a member selected from the class consisting of a cyano group and a carbalkoxyl group.

Relatively high quantum efficiencies (i.e., number of carriers collected per absorbed photon) have been obtained with the following three merocyanine dyes using electrodes comprised of aluminum (exposed to the light source) and gold or silver:

| Dye No. | Structure | Quantum Efficiency |
|---|---|---|
| A | | 22% |
| B | | 14% |
| C | | 32.5% (vacuum deposited) |

THE INSULATING LAYER

Optionally, the device of the present invention has an insulating layer interposed between organic layer and the second electrode, i.e. the electrode which is comprised of an element that has a work function equal to or less than that of aluminum. This insulating layer is comprised of electrically non-conducting oxides. Especially favored are the oxides of Al, Si and Ti. The insulating oxide may be an oxide of the same element comprising the second electrode or the insulating oxide may be a different oxide. The insulating oxide layer is not unusually thick. Indeed, the layer is generally less than about 30 Angstroms thick and preferably less than about 25 Angstroms thick, but can range, for example, from above about 0.5 Angstroms thick.

GENERAL PROCEDURE FOR FABRICATION OF THE PHOTOVOLTAIC DEVICE

The general procedure outlined below utilizes a substrate (e.g., glass, "Mylar", etc.) to facilitate fabrication.

1. Cleaning of substrate — e.g., ultrasonic cleaning, vapor degreasing, rinsing with deionized water, etc.

2. Deposition of bottom electrode — e.g., by painting, spraying, etc. of the element in the form of a solution or dispersion of the element such as silver paste, gold paste, etc.; vacuum deposition (sublimation or evaporation) of the element in a pure state (this is preferred); application of the element in the form of an organometallic followed by vacuum heating (at least the decomposition temperature of the organometallic) to remove the organic moiety; etc. Metallized transparent films, e.g. aluminum coated on "Mylar" may be used as is (subject only to a cleaning of its surface if necessary) thereby eliminating cleaning and deposition of the bottom electrode. Similarly, foils may be used (e.g. Al foil) for the bottom electrode if it is not intended to be exposed to the light source.

3. Deposition of the Insulating Layer

The optional insulating oxide layer is provided by oxidation of the electrode via exposure to air or oxygen at ambient or elevated temperatures when the bottom electrode is formed from an element which readily forms an oxide. Vacuum deposition of an oxide of the same element or a different element used in the bottom or second electrode, is another alternative.

4. Deposition of the Organic Layer

The organic layer is then deposited on the surface of the bottom electrode or the insulating layer. Deposition of the organic compounds may take place by evaporation of solvents, from dispersions, from melts, by vacuum deposition (preferred), by spraying, brushing, etc. When more than one organic compound is applied, each compound may be applied sequentially or a mixture of compounds may be applied in a single deposition step.

5. Deposition of the top electrode

The element comprising the top or first electrode is deposited on the top surface of the organic layer by the same techniques described above for deposition of the bottom or second electrode. Here again, metallized transparent films, foils, if not intended to be exposed to the light source, etc. may be used as is, instead of deposition of the top electrode; in the case of such films, foils, etc., it is desirable to have intimate face-to-face contact with the bottom side of the top electrode and the top side of the organic compound.

6. Applying leads to the electrodes

After the device has been constructed as outlined above, electrical leads (e.g., of copper wire, silver wire, etc.) are attached to the top and bottom electrodes by e.g. soldering, silver paste, ultrasonic bonding, compression bonding, etc. The device upon exposure of one electrode (whose thickness permits light transmission) to a visible light source (e.g. sunlight) is then capable of converting such light into electrical current. The device will continuously generate electrical current so long as it is continuously exposed to such light source and so long as the electrical current is continuously drawn off from the device (e.g. through the leads). As an optional feature, it is desirable to hermetically seal all exposed surfaces of the device with a layer of transparent material, e.g. glass, "Mylar", silicon monoxide film, etc. thereby excluding air and moisture from the device and thus avoiding possible degradation of the organic compound.

The following examples serve to illustrate the actual preparation and results of the photovoltaic device:

EXAMPLE 1

Dye "A", having the structure set forth above, was prepared as follows: 3-ethyl-5-[(3-ethyl-2-(3H)-benzothiazolidene) ethylidene] rhodamine purchased from Japanese Research Institute for Photosensitizing Dyes Co., Ltd. was dissolved in nitrobenzene (10% solution) and heated to 130° C. for 30 minutes with an equivalent of dimethyl sulfate. The resultant reaction product was thereafter precipitated with three volumes of ether, filtered and recrystallized from acetonitrile; the recrystallized reaction product had a melting point of 216° C. Three grams (6.3 mmol) of the recrystallized reaction product and 1.45 g. (6.3 mmol) of 3-ethyl-5-ethoxyethylidenerhodamine were heated at reflux in 1.5 ml. of triethylamine and 30 ml. of pyridine for 15 minutes. The reaction was cooled, filtered and the isolated product recrystallized from pyridine; the resultant recrystallized dye "A" had a melting point of 246°–248° C. Dye "A" was then utilized in the form of an organic solution in boiling solvent-grade ethylene chloride at a concentration of 15 mg/cc.

In preparing the photovoltaic device, a substrate was utilized. The substrate for this photovoltaic device was a Corning Micro Slide (No. 2947) having an area of approximately 2.5 cm. $\times$ 3.7 cm. and a thickness of 1.0 mm. The substrate was first placed in a Fluoroware rinse tank employing nitrogen gas bubbling through deionized water for 5 minutes. Upon removal, it was immediately blown dry with nitrogen gas and thereafter placed in a Headway Research vapor degreaser employing reagent grade isopropyl alcohol heated above its boiling point. The slide was degreased in this manner for 10 minutes and blown dry with nitrogen gas upon removal. The clean slide was then placed in a vacuum system and pumped down to a pressure of approximately $1.0 \times 10^{-6}$ mm. Hg. An aluminum film of 63% transparency was then deposited over half of the slide using 99.9% pure Ladd Research aluminum at a source-to-substrate distance of approximately 15 cm. Upon removal from the vacuum system, the slide was placed on a Headway Research Spinner and spun at 4,000 rpm. Four drops of the solution of Dye "A" were then applied to the spinning slide using an eye dropper. This resulted in a film thickness of about 400 Å.

The cell now consisting of the organic layer on the aluminized glass substrate was placed back in the vacuum system. A metal mask with openings of 0.1 $\times$ 2 cm.

was then placed over the cell such that a 0.5 cm. length would overlap the bottom aluminum electrode. A silver layer of about 200 Å was then deposited onto the organic layer through the mask. The silver used was 99.9% Ladd Research grade. The vacuum was again 1.0 × $10^{-6}$ mm. Hg with a 15 cm. source-to-substrate distance. The completed cell was then removed from the vacuum system and conductive silver paint was painted onto the inactive end of each electrode to effect better electrical contact to the pressure contacts in the sample chamber.

As soon as the silver paint dried, the sample was then placed in the sample chamber and maintained in an environment of dry nitrogen gas. Measurements of the sample efficiency were then made as follows. The sample was exposed to a source of monochromatic light of 6300 Å which resulted from using a tungsten-halogen lamp in conjunction with a monochromator with a bandpass of 100 Å. The light intensity at that distance was previously calibrated using an Eppley thermopile. The sample produced a current of 6.7 × $10^{-7}$ amps as measured by a Keithley 616 digital electrometer. For a measured light intensity of 0.58 mw/cm$^2$, a sample area of 0.05 cm$^2$ and an electrode transmission of 63%, this resulted in a monochromatic quantum efficiency of 10%. Monochromatic quantum efficiencies as high as 22% were obtained with some samples. The sample was then placed in sunlight of 40 mw/cm$^2$ intensity and produced a short circuit current of 10 microamps and an open circuit voltage of 0.9 volts. For a measured fill factor of 0.25, this resulted in a sunlight engineering efficiency of 0.11%. The results were the same when the measurements were made in ambient air rather than nitrogen gas.

EXAMPLE 2

Dye "B" was prepared as follows: 2-anilidovinyl-1-ethyl-3,3-dimethyl indolium iodide was prepared according to the procedure set forth by L. G. S. Brooker et al, J. Am. Chem. Soc., Volume 73, page 5332 (1951). 2.8 g. (6.7 mmole) and 1.7 g. (8.9 mmole) of 3-carboxymethylrhodamine (obtained from Aldrich Chemical Co.) in 2 ml. of triethylamine and 30 ml. of ethanol were heated at reflux for 20 minutes. The reaction mixture was subsequently evaporated to dryness and the residue was recrystallized sequentially from acetic acid-water and benzene; the recrystallized Dye "B" had a melting point of 224° C.

Dye "B" was then utilized to prepare a photovoltaic device using the same procedure set forth above for Example 1. In addition, the measurements of the photovoltaic device utilizing Dye "B" were also performed in the same manner. For 0.87 mw/cm$^2$, 5430 Å light incident on the 20% T aluminum electrode, a current of 5.5 × $10^{-7}$ amp was measured for the 0.05 cm$^2$ device. This resulted in a quantum efficiency of 14.4%. The output in 85 mw/cm$^2$ sunlight was a short circuit current of 3.5 microamps and an open circuit voltage of 1 volt. The resultant sunlight engineering efficiency for a fill factor of 0.25 and normalized to a 50% T aluminum electrode is 0.05%.

EXAMPLE 3

In this example, Dye "C" was purchased from Gallard-Schlessinger Chemical Mfg. Corp. Dye "C" was then utilized to prepare a photovoltaic device using the same procedure as outlined in Example 1, except that the solvent for Dye "C" was solvent-grade pyridine at its boiling point. The measurements of the photovoltaic device were also performed in the same manner. A current of 1.6 × $10^{-7}$ amps was recorded for 0.4 mw/cm$^2$, 5500 Å light incident on the 11% T aluminum electrode. For an effective sample area of 0.08 cm$^2$, this resulted in a quantum efficiency of 10.2%. The open circuit voltage in this light was 0.72 volts. The sunlight efficiency for this device was not measured.

EXAMPLE 4

This example utilized vacuum sublimation to deposit the dyestuff (which was the same Dye "C" employed in Example 3). Corning "7059" glass slides were used as the substrate (dimensions: 1 inch × 1½ inches and 0.05 inch thick). Prior to use, the slides were cleaned as follows:

(a) brushed to remove lint;
(b) scrubbed with cotton swabs and warm detergent solution;
(c) rinsed in deionized water for one minute;
(d) ultrasonically cavitated in warm detergent solution for about 10 minutes;
(e) rinsed in deionized water for 2 minutes;
(f) rinsed for about 10 minutes in deionized water with nitrogen gas being bubbled through;
(g) blown dry with filtered nitrogen;
(h) vapor-degreased using isopropyl alcohol;
(i) blown dry with filtered nitrogen;
(j) stored in a polypropylene box.

The cleaned glass substrates were subsequently placed in a "Veeco 776" vacuum evaporator and the pressure was reduced to about $10^{-7}$ Torr. A 40 Angstrom film of aluminum was evaporated onto the substrates at the rate of 8 Angstroms per second; the aluminum was present in the form of "horseshoes" and hung on a tungsten filament which in turn was heated by electrical resistance heating. After deposition of the aluminum was completed, the vacuum chamber was exposed to air for about 30 minutes and subsequently pumped down again to a pressure of about $10^{-7}$ Torr.

Dye "C" was sublimed by placing it in a quartz crucible covered with a thin layer of quartz wool. The crucible was heated in a R.D. Mathis tantalum crucible heater (heated by electrical resistance). A 100 Angstrom layer of Dye "C" was sublimed, at the rate of 11 Angstroms per second, onto the surface of the aluminized substrates at a sublimation temperature of 250° C. Without breaking vacuum, a 110 Angstrom layer of silver was evaporated onto the surface of Dye "C" from an electrical resistance-heated tantalum boat; vacuum was then broken by exposure to air.

The finished cell had an effective cell area of 1.1 cm$^2$. It exhibited a short circuit photovoltaic current of 4.86 × $10^{-5}$ amp/cm$^2$ when monochromatic light of 9.35 × $10^{14}$ photons/cm$^2$-sec. at 550 mm incident on the cell through the aluminum electrode; the transmission of light through the aluminum and the Corning "7059" glass was determined to be 63% and 92%, respectively, and of the light passing through the glass and aluminum, 46.3% was absorbed by Dye "C". From these data, a monochromatic efficiency of 32.5% at 550 mm was obtained.

EXAMPLE 5

This example illustrates the fabrication of a device having more than one organic compound in the organic layer. In this example, the method of cleaning the glass substrate and the deposition of the aluminum and silver electrodes were identical to the procedure outlined in Example 4; however, the organic layer was formed by placing several drops of a pyridine solution containing Dye "C" and Dye "E" on the aluminum coated slide while spinning at 4000 rpm. Dye "E" is an internal charge compensated cyanine dye having the formula

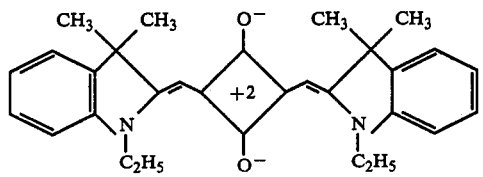

and named a squarylium. Devices having varying amounts of Dye "C" and Dye "E" were prepared. The absorption spectra and photocurrent action spectra consisted of contributions from each of the dyes. For purposes of comparing the relative performance of each dye, activity at 5100 Å was monitored for Dye "C" and at 6700 Å for Dye "E". The compositions and relative activities are given in Table I below:

Table I

| Run No. | Mole % Dye "E" in Dye "C" | Absorbance at 5100 Å | Absorbance at 6700 Å | Photo current (relative) at 5100 Å | Photo current (relative) at 6700 Å | Quantum Efficiency 5000 Å | Quantum Efficiency 6817 Å |
|---|---|---|---|---|---|---|---|
| 1 | 14.3 | .67 | .33 | 6.9 | 2.5 | 3.1% | 1.4% |
| 2 | 21.4 | .47 | .30 | 9.0 | 5.5 | 12.0 | 6.3 |
| 3 | 28.6 | .54 | .51 | 9.0 | 6.0 | 17.1 | 9.5 |
| 4 | 35.7 | .50 | .55 | 7.4 | 10.6 | 6.9 | 7.3 |

It is apparent that each component is contributing to device output with the relative contribution of each being a function of device composition. In 30 mw/cm$^2$ sunlight a 28.6 mole % device exhibited an open circuit voltage of 0.8 volt and a sunlight engineering efficiency of 0.037%.

EXAMPLE 6

This example illustrates sequential deposition of two organic compounds to form the organic layer. In this example, the techniques employed in Example 4 were followed except that the organic compounds were deposited sequentially by evaporation of the dye from heated crucibles.

Table II below sets forth the amount of dye employed and the resulting monochromatic efficiencies at the absorption maximum for the device. In Table II, Dye "E" refers to squarylium, the structural formula of which is given in Example 5. Also, in Table II the order of the dyes from right to left is the order of deposition on the bottom or second electrode.

Table II

| Cell | Dye | Thickness | Dye | Thickness | Monochromatic Efficiency |
|---|---|---|---|---|---|
| 1 | "C" | 100 Å | "E" | 100 Å | 5.7% |
| 2 | "E" | 100 Å | "C" | 100 Å | 25% |
| 3 | "E" | 100 Å | "C" | 50 Å | 7% |
| 4 | "C" | 100 Å | "E" | 50 Å | 4.4% |
| 5 | "E" | 50 Å | "C" | 100 Å | no output |
| 6 | "C" | 100 Å | "E" | 200 Å | 4.7% |

EXAMPLE 7

This example illustrates the use of an insulating film interposed between the second electrode, i.e. the electrode having an element with a work function equal to or less than aluminum. In this example, the techniques described in Example 4 were followed employing aluminum as the second electrode, Dye "C" as the organic layer and gold as the first electrode, except that after deposition of the aluminum, the aluminum surface was exposed to air to oxidize some of the aluminum and provide an insulating layer. The device was completed then in the normal fashion. An immediate testing of the device showed a marked high open circuit voltage of 0.949 volts peak (monochromatic light). A device which did not have the aluminum so exposed did not exhibit the high open circuit voltage. Indeed, in similar tests in which devices were exposed to air for from 1 to 7 hours to partially oxidize the aluminum showed increasing open circuit voltages with increase in the exposure to air.

What is claimed is:

1. A photovoltaic device for the conversion of light to electrical current comprising:
   (a) a first electrode and a second electrode, said first electrode comprising an element having a work function greater than that of aluminum and said second electrode comprising an element having a work function equal to or less than that of aluminum and at least one of said first and second electrodes being substantially transparent to said light, said element of said first electrode and said element of said second electrode being: (1) non-gaseous at 20° to 100° C. and atmospheric pressure, (2) non-radioactive, (3) not explosively reactive with water, and (4) electrically conductive; and
   (b) an organic layer between said first and said second electrodes, one surface of such layer being in Schottky barrier contact with said second electrode and the other surface of such organic layer being in ohmic contact with said first electrode, said organic layer comprising at least one organic compound selected from organic compounds which have the capacity to sensitize or de-sensitize a material selected from the group consisting of silver halides, titanium dioxide, zinc oxide, cadmium sulfide, selenium and polyvinylcarbazole; and
   (c) an insulating layer interposed between said organic layer and said second electrode, said insulating layer comprising an electrically nonconducting oxide.

2. The device of claim 1 wherein said insulating layer has a thickness less than about 30 Angstroms.

3. The device of claim 2 wherein said oxide is an oxide of the same element comprising said second electrode.

4. The device of claim 2 wherein said oxide is an oxide of a different element of said second electrode.

5. The device of claim 2 wherein said oxide is selected from oxides of aluminum, silicon and titanium.

6. The device of claim 2 in which said first electrode comprises an element selected from the group consisting of gold, silver, platinum, rhenium, iridium, mercury, bismuth, tungsten, osmium, tin, palladium, rhodium, ruthenium, molybdenum, copper, nickel, cobalt, iron, chromium and carbon and said second electrode comprises an element selected from the group consisting of aluminum, magnesium, beryllium, calcium, scandium, titanium, vanadium, lithium, magnesium, zinc, gallium, strontium, yttrium, zirconium, niobium, cadmium, indium, antimony, barium, lanthanum, cerium, praseodinium, neodymium, promethium, saramium, europium, gadolinium, terbium, dysprosium, holmium, erbium, thulium, ytterbium, lutetium, hafnium, tantalum and lead.

7. The device of claim 6 in which the thickness of that element employed in that electrode which is exposed to the light source ranges from about 20 to about 200 Angstroms.

8. The device of claim 6 in which said element of said first electrode is gold.

9. The device of claim 6 in which said element of said first electrode is silver.

10. The device of claim 6 in which said element of said second electrode is aluminum.

11. The device of claim 6 in which said element of said second electrode is magnesium.

12. The device of claim 2 in which the organic layer ranges in thickness from about 50 to about 100,000 Angstroms.

13. The device of claim 2 wherein the organic compounds of said organic layer are selected from merocyanine dyes having an amidic chromophoric system.

14. The device of claim 13 in which the dyestuff is a merocyanine dye represented by the general formula:

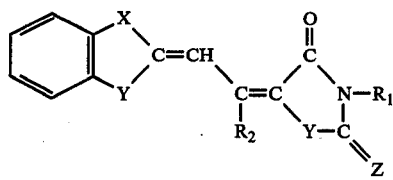

wherein X represents a member selected from the class consisting of sulfur, oxygen, $NR_3$ groups and $C(R_4)_2$ groups in which $R_3$ and $R_4$ are alkyl groups; Y represents a member selected from the class consisting of sulfur, oxygen and $NR_3$ groups; $R_1$ represents a member selected from the class consisting of carboxyalkyl groups, hydrogen, alkyl groups and carbalkoxyalkyl groups; $R_2$ represents a member selected from the class consisting of hydrogen and alkyl groups; and Z is a member selected from the class consisting of sulfur, oxygen and

groups in which J represents a member selected from the class consisting of a cyano group and the atoms with Q necessary to complete a heterocyclic ring selected from the class consisting of those of the oxindole series, those of the rhodanine series, those of the 2-thio-2,4-oxazolidinedione series, those of the 2-thio-2,5-thiazolidinedione series, those of the 2,4-thiazobdinedione series, those of the thiazolidinone series, those of the 4-thiazolinone series, those of the 2,4-imidazolinedione series, those of the 2-thio-2,4-imidazolinedione series, and those of the 5-imidazolinone series, Q, when J represents a cyano group, represents a member selected from the class consisting of a cyano group and a carbalkoxyl group.

15. The device of claim 14 in which the merocyanine dye has the structure:

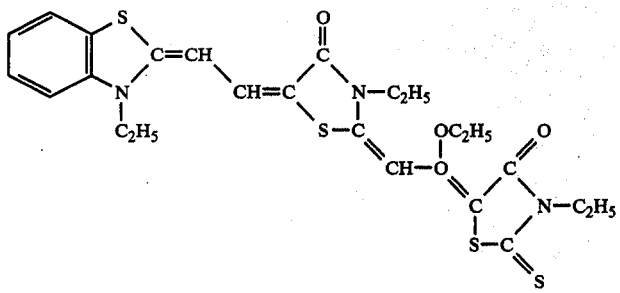

16. The device of claim 14 in which the merocyanine dye has the structure:

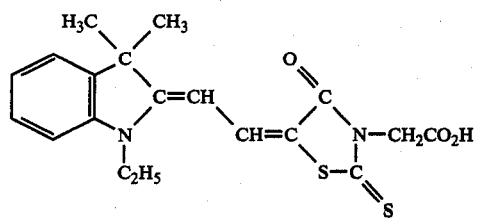

17. The device of claim 14 in which the merocyanine dye has the structure:

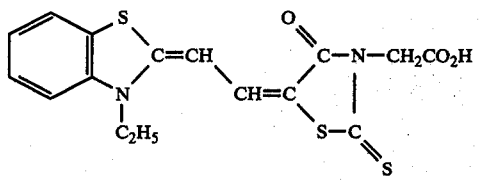

18. The device of claim 13 wherein said organic layer comprises two organic compounds one of which is a merocyanine dye and the other is an internally charge compensated cyanine dye.

19. The device of claim 18 wherein said organic layer comprises two organic compounds, one of which has the formula:

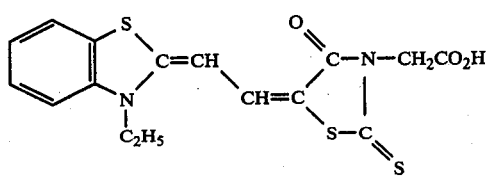
and the other of which has the formula:
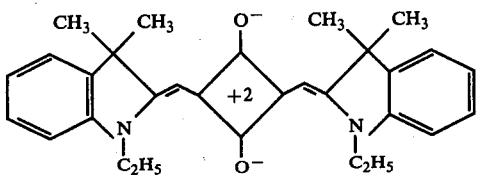
* * * * *